United States Patent
Audet et al.

(10) Patent No.: US 6,461,443 B1
(45) Date of Patent: Oct. 8, 2002

(54) METHOD AND APPARATUS FOR CONTINUOUS CLEANING OF SUBSTRATE SURFACES USING OZONE

(75) Inventors: Jean Audet, Granby; Mario Leboeuf, Canton-de-Granby; Isabelle Tremblay, Bromont; Herbert P. R. Wossidlo, Granby, all of (CA)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/574,889

(22) Filed: May 19, 2000

(30) Foreign Application Priority Data

Jun. 4, 1999 (CA) ............................................. 2273717

(51) Int. Cl.⁷ ................................................. F23J 1/00
(52) U.S. Cl. ........................ 134/19; 134/21; 134/25.1; 134/26; 134/30; 134/32; 134/39
(58) Field of Search .......................... 134/19, 21, 25.1, 134/30, 32, 39, 26; 34/543, 565, 580

(56) References Cited

U.S. PATENT DOCUMENTS 4,341,592 A * 7/1982 Shortes et al. ................. 134/2
5,445,699 A * 8/1995 Kamikawa et al. ......... 118/715

FOREIGN PATENT DOCUMENTS

JP 01069014 * 3/1989 ......... H01L/21/304

* cited by examiner

Primary Examiner—Randy Gulakowski
Assistant Examiner—M. Kornakov

(57) ABSTRACT

The present invention provides new and improved methods and apparatus for removing contamination from surfaces of substrates. Existing techniques include plasma ashing, glow discharge or UV/ozone processes. The present invention includes cleaning the substrate surfaces by transporting the substrates to be cleaned through a first zone where the substrates are heated preferably in a nitrogen atmosphere and then to a second zone where the substrates are surrounded by an atmosphere of ozone. The organic contamination is thereby vaporized into vapor products including $CO$, $CO_2$ and $H_2O$.

5 Claims, 3 Drawing Sheets

METHOD AND APPARATUS FOR CONTINUOUS CLEANING OF SUBSTRATE SURFACES USING OZONE

FIELD OF THE INVENTION

The present invention generally relates to removing contamination from the surface of substrates used in the fabrication of micro electronic devices. In particular, the invention relates to the use of methods and apparatus for removing residual organic contamination from the surfaces of such substrates using ozone so as to prepare the substrates for further processing in a manner which is more efficient and effective than is presently implemented.

BACKGROUND OF THE INVENTION

A variety of processes are known and are presently used in the microelectronics industry for cleaning surfaces of substrates. Cleaning processes and surface preparation are required in micro electronic device manufacturing as it is essential to ensure a contamination-free surface before subsequent processing steps can be performed on substrates. In the micro electronic industry today, these contaminants are removed by a variety of processes including plasma ashing and UV/ozone processes. Plasma ashing seems to be the most popular method used in the industry whereas existing UV/ozone and heat/ozone processes are also used only if the substrates to be treated can be positioned close to the UV emission so as to generate the ozone adjacent to the part to be treated. The characteristics of the present cleaning systems reduce them to use in a batch mode and as a result, a limited number of substrates can be treated over a period of time.

Plasma cleaning, also known as glow discharge cleaning, is a process performed with reactive ionized gas in order to obtain an appropriate surface on the substrate before other operations such as plating or masking can be introduced. This process results in chemical reactions without the need of exposing the surfaces to high temperatures. To produce the volatile atmosphere, typically molecular gases including oxygen, are flowed into the chamber and are dissociated to varying degrees in the plasma generated by the application of RF or microwave energy. A chemically active mixture of electrons, ions and free radicals are generated with photon energy being emitted when excited particles lose energy in transit to a lower energy state. As a result, the part or substrate to be cleaned is processed by a combination of physical effects including ion bombardment and chemical processes which react with contamination existing on the surface of the substrate in the form of carbon to produce products such as residual surface ash and CO and $CO_2$ and $H_2O$.

The use of the combination of ultraviolet rays and ozone is widely used today in methods for cleaning substrates and particularly as a pre-treatment of these surfaces before further processing by the use of polymers. An ozone producing lamp is placed adjacent to and within a few centimeters of the substrate to be cleaned or treated. The high energy light from the ultraviolet lamp produces atomic oxygen and ozone which reacts with contamination on the surface of the substrate in the form of carbon to produce products including CO and $CO_2$ and $H_2O$. This method has been found to be useful however the organic contaminant removal rate is relatively low if additional energy (heat) is not added to the process.

Representative examples and variations of the above summarized processes are contained in a number of prior art references. The following references are representative of the above prior art and are considered to be processes which are limited to the use of directly heating the items to be cleaned simultaneously with subjecting the items to ozone and none of which include a description of a continuous inline process of the nature of the invention as presented herein:

U.S. Pat. No. 5,762,755
U.S. Pat. No. 5,747,387
U.S. Pat. No. 5,709,754
U.S. Pat. No. 5,480,492
U.S. Pat. No. 5,228,206
U.S. Pat. No. 5,178,682
U.S. Pat. No. 5,044,314
Japanese Published Patent Application No. 3165028A
Japanese Published Patent Application No. 3088329A
Japanese Published Patent Application No. 3046225A
Japanese Published Patent Application No. 2106040A
Japanese Published Patent Application No. 6133529A
Japanese Published Patent Application No. 63099529A
Japanese Published Patent Application No. 61194830A A representative explanation and the technical and scientific reasoning for the removal of organic contamination material from the surfaces of electronic devices using ozone is provided in the publication "Critical Process Variables for UV-Ozone Etching of Photoresist", Peter C. Wood et al, Materials Research Society Symposium Proceedings, Volume 315, copyright 1993 Materials Research Society, pp. 237–242.

In some devices using ceramic substrates, a diffusion step is needed between two metals such as nickel, gold and molybdenum in order to ensure a good bond of the circuitry to the substrate. The prior art methods are not satisfactory in that case. It has been found that this diffusion step could result in organic stains on the ceramic and metallized surfaces. These stains originate as a result of such factors including the contamination in the atmosphere, the normal work environment, residual material from the resin remaining on the surface, and even fingerprints of humans when substrates are subsequently heated, for example, to carry out a diffusion step. In the manufacturing of flip chip assemblies, it may also be that any fibers or residual organic material on a substrate will result in carbon stains after solder reflow steps. It has been found that no matter how clean the atmosphere in the work environment there are usually resulting carbon stains on the surfaces of these substrates which could result in defective processing during subsequent steps. It is these types of carbon stains that have been found to be not effectively removed by known cleaning processes to which the subsequently described invention is primarily addressed. The invention has been found to be effective in the removal of these types of stains resulting from relatively high temperature processes and the invention can be thought of as a relatively mild cleaning procedure where carbon based stains are dissipated from the surface into vapor including CO, $CO_2$ and $H_2O$ as opposed to the more robust high temperature etching procedures of the prior art which reduces the surface contamination to removable ash.

BRIEF DESCRIPTION OF THE INVENTION

It is an object of the present invention to provide a new method and apparatus for removing contamination from the surfaces of substrates by the vaporization of the contamination.

It is a further object of the invention to provide for the removal of contamination at lower temperatures than are used in the prior art.

It is a further object of the invention to make use of ozone for the removal of contamination of the surface of substrates which does not require the addition of any heating or other energy in the ozone zone.

It is a further object of the invention to provide a method and apparatus for the continuous and inline removal of contamination from the surfaces of substrates.

It is a further object of the invention for the cleaning and treatment of surfaces of substrates where a plurality of substrates are involved and the substrates may be layered or tiered so that all surfaces of the substrates can be treated at the same time.

These and other objects and advantages of the present invention are apparent from the detailed description and the preferred embodiments which subsequently follows.

According to one aspect of the present invention, there is provided a process for removal of carbon based substances from the surfaces of one or more substrate. The process includes the step of transporting the substrates to a first zone where the substrates are heated to a temperature of at least 125° C. The heated substrates are then transported to a second zone where the substrates are surrounded by an atmosphere containing ozone whereby the carbon based substances on the surfaces of the substrates are removed as vaporized products including CO, $CO_2$ and $H_2O$.

According to one aspect of the present invention, there is provided a continuous process for cleaning the surfaces of one or more substrates of organic contamination existing on the surfaces of the substrates. The process includes the steps of transporting the substrates to a first zone where the substrates are heated in a nitrogen environment to a temperature of at least 125° C. The heated substrates are then transported to a second zone which is at room temperature where the substrates are surrounded by an atmosphere of ozone whereby the organic contamination on the surfaces is vaporized.

According to a further object of the invention, there is provided an apparatus for removal of carbon based substances from the surfaces of one or more substrates, comprising means for transporting the substrates to a first zone where the substrates are heated by heating means, to a temperature of at least 125° C., and means for transporting the heated substrates to a second zone which includes means for surrounding the substrates with an atmosphere containing ozone, whereby the carbon based substances on the surfaces are vaporized.

According to a further object of the invention, there is provided apparatus for cleaning the surfaces of one or more substrates of organic contamination on the surfaces of the substrates. The apparatus includes means for transporting substrates through a first and a second chamber. The first chamber includes means for heating the substrates to a temperature of at least 125° C., in a nitrogen environment. The second chamber, which is at room temperature, includes means for surrounding the substrate by an atmosphere of ozone whereby the organic contaminant on the surfaces thereof is vaporized into vapor products including CO, $CO_2$ and $H_2O$.

BRIEF DESCRIPTION OF THE DRAWINGS

The foregoing and other objects, aspects and advantages of the invention will be better understood and illustrated by way of example, and not of limitation, with reference to the accompanying drawings in which.

DESCRIPTION OF THE PREFERRED EMBODIMENT OF THE INVENTION

Figure 1:
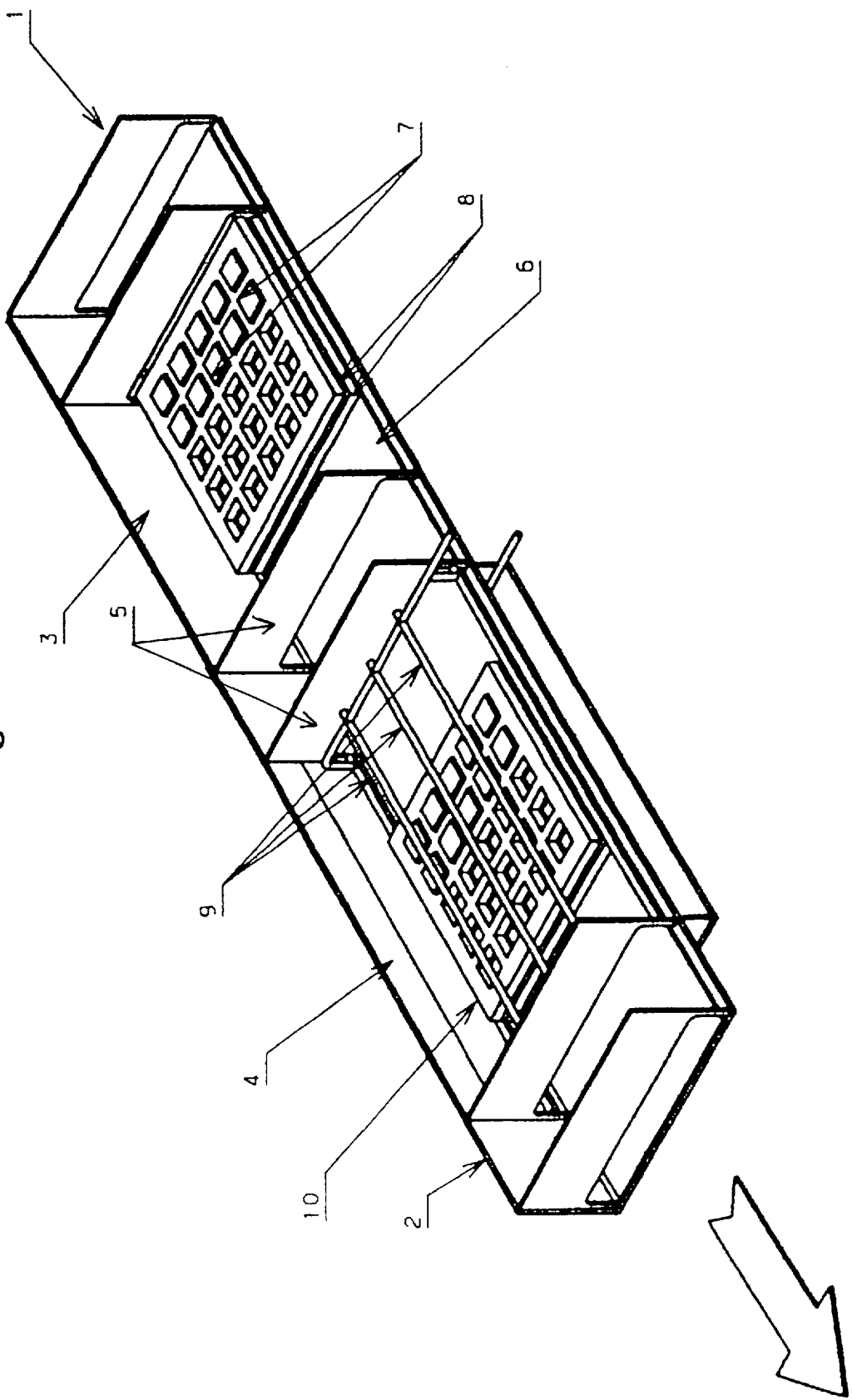
FIG. 1 is an isometric drawing of a somewhat schematic apparatus showing two separate zones for treating the substrates.

A description of the nature of the inventive apparatus that can be used to implement the invention will be provided in association with FIG. 1, which is a somewhat abstract drawing of cleaning apparatus generally referred to by reference 1 in accordance with the invention. For explanation of the invention, only a representative wall 2 of the apparatus is shown. However, it is understood that the apparatus is enclosed with walls including a top and bottom. It is not necessary for apparatus I to be a sealed chamber but it need be sufficiently enclosed to form two separate treatment zones shown by reference 3, the heating zone and reference 4, the ozone treatment chamber or zone. Zones 3 and 4 within the chamber are separated by one or more inner walls 5. A means for carrying and moving the electronic devices or substrates to be cleaned between heating zone 3 and ozone treatment zone 4 is provided such as by continuous conveyor 6. Appropriate heating devices (not shown) as known to those skilled in the art, are used to heat the atmosphere in zone 3. Any suitable heating means could be used such as infrared heating devices. To maintain zone 3 as a clean and stable environment so as to eliminate the addition of any further contamination to the devices to be cleaned, it is preferred to have an atmosphere in zone 3 which is reduced in oxygen. This then minimizes further oxidation when the substrates are subsequently heated. It has been found that an atmosphere high in nitrogen, argon or other suitable inert gas may be used as a non-reactive atmosphere to reduce oxidation on the surfaces of the substrates, if so required. If further oxidation on the surfaces is not a concern, then gas other than air may be not required. Appropriate means for distributing ozone to the surfaces of substrates in ozone chamber 4 includes ozone tubes 9 with nozzles or inlets to provide a rich ozone environment for the substrates. Ozone can be supplied to tubes 9 in any well known manner.

This manner of process atmosphere control and/or separation allows for the internal pressure of process chamber to be close to normal atmospheric pressure (1 atmosphere). This in turn allows for the substrates to be shuttled through the apparatus without the use of separation doors. Any additional time needed to attain pressure equilibrium is eliminated.

In operation of cleaning apparatus 1, substrates 7 are placed on a carrier or holder 8. Only a representative number of substrates is shown in FIG. 1 and it is understood that more or less substrates could be simultaneously treated. In turn, substrates 7 on an appropriate holder 8 are placed on conveyor 6 to the right of apparatus 1. As conveyor 6 moves to the left in apparatus 1 the substrates 7 enter heating zone 3 where the temperature of the substrates is raised to at least 125° C.

The preferable temperature range is 200° C. to 270° C. Although the temperature of the substrates may be raised to a temperature above 270° C. within practical limits so as not to adversely affect the substrates as would be apparent to those skilled in the art, such higher temperatures are not believed to provide significant additional benefits from use of the subject invention. The linear speed of the conveyor would be adjusted so that the substrates are raised to the appropriate temperature. After substrates 7 are heated to the appropriate temperature in the nitrogen atmosphere in heating zone 3, conveyor 6 continues to carry them under separation wall 5 into ozone chamber 4. Here the surfaces of substrates 7 are treated by the presence of the ozone-rich atmosphere as substrates 7 continue to be moved and conveyed by conveyor belt 6 towards the exit of apparatus 1 to the left, as shown in FIG. 1. During the transport through ozone chamber 4, any carbon base substances existing on the surfaces of substrates 7 are removed from the surfaces by being vaporized as vapor products including CO and $CO_2$ and $H_2O$ as had been explained above. The carbon based substance may be any form of organic contaminant, organic resin, carbon or graphite. Once exiting from the left of zone 2 as shown in FIG. 1, the substrates are removed from the conveyor either manually or automatically.

Figure 2:
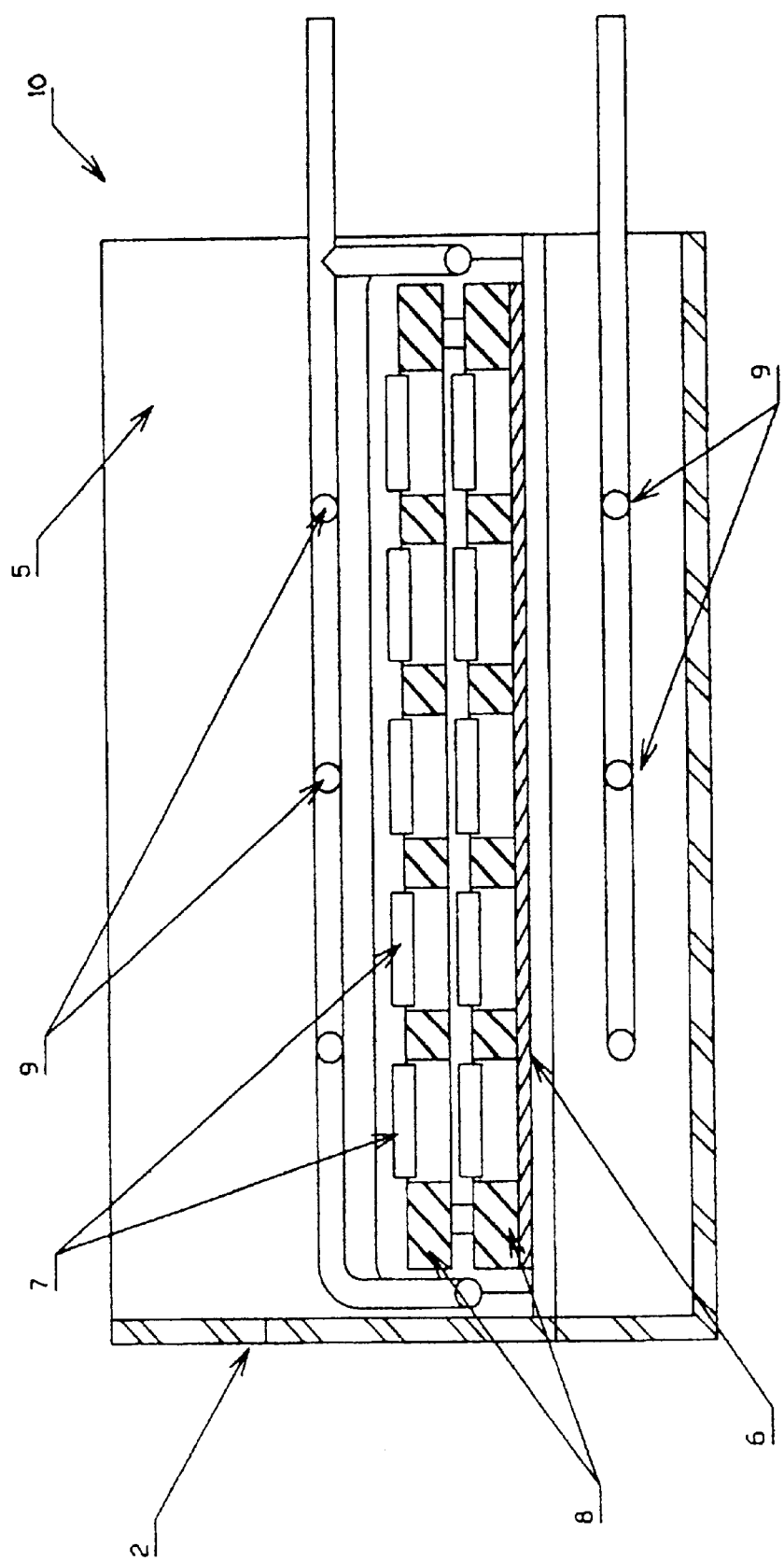
FIG. 2 is a drawing of a multi-tiered carrier for conveying the substrates through the apparatus of FIG. 1.

It has been found that useful and satisfactory cleaning results can be achieved from this invention without specifically directing the ozone from distribution tubes 9 to the surfaces of the substrates but merely making the ozone available in such a way that a rich ozone atmosphere surrounds the surfaces of the substrates. It is therefore practical to treat all surfaces of numerous substrates and to clean and remove contamination from these substrates all at the same time. FIG. 2 shows an embodiment of a carrier device to achieve this. The same reference numerals used to represent common elements in FIG. 2 as were used in FIG. 1. Multi-tiered carrier, generally shown by reference 10, consists of a plurality of tiers or shelves upon which the substrates 7 are loaded. Multi-tiered carrier 10 is placed on conveyor 6 which is then directed through heating zone 3 and ozone chamber zone 4 in a similar manner as was described for FIG. 1. It can be seen that this embodiment provides for continuous and inline removal of contamination from the surfaces of the substrates and provides for the efficient cleaning and treatment of all of the surfaces of multiple substrates at the same time.

Figure 3:
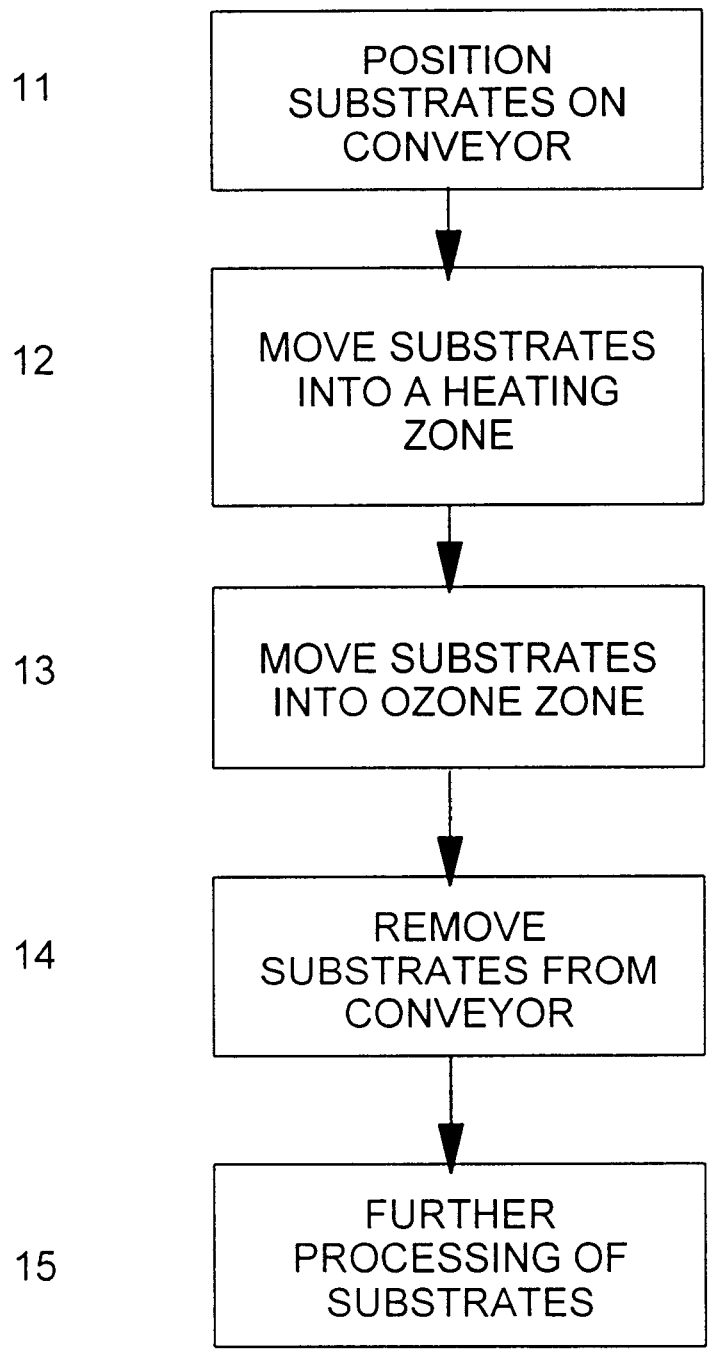
FIG. 3 is a flow diagram showing the sequence of steps in the inventive method for cleaning the surfaces of substrates.

In conjunction with the description of the apparatus as provided for FIGS. 1 and 2, a description of the sequence of steps in a method for cleaning the surfaces of substrates will be described with reference to FIG. 3. The first step shown at 11 is to appropriately position one or a plurality of substrates 7 on a conveyor such as conveyor 6 shown in FIGS. 1 and 2. The next step shown at 12 results in conveyor 6 moving substrates 7 into a heating zone 3 so as to raise the temperature of substrates 7. Conveyor 6 then moves heated substrates 7 into ozone chamber zone 4 as shown at step 13. Since there is no further heating occurring in ozone chamber 4, the temperature of substrates 7 will gradually decrease from the temperature at which they were heated in heating zone 3. Once the conveyor is moved out of apparatus 1 substrates 7 are removed from the conveyor in an appropriate fashion at step 14. The substrates are then ready for further processing as shown at 15. Preferred embodiments of the present invention have been described herein above by way of example only and not by way of limitation such that those skilled in the art will readily appreciate that numerous modifications of detail may be made to the present invention, all coming within its spirit and scope.

The embodiments of the invention in which an exclusive property or privilege is claimed are defined as follows:

1. A process for removal of carbon based substances from the surfaces of one or more substrates, comprising the steps of transporting the substrates to a first zone where the substrates are heated to a first temperature of at least 125° C.; and transporting the heated substrates to a second zone where the substrates are surrounded by an atmosphere containing ozone, whereby the carbon based substances on the surfaces of said substrates are vaporized, wherein the temperature of the atmosphere in said second zone is lower than the temperature of the atmosphere of said first zone.

2. The process according to claim 1 wherein the substrates are transported by a continuously moving conveyor.

3. The process according to claim 1 wherein the substrates are heated in said first zone in an inert atmosphere containing elements selected from the group consisting of nitrogen or argon, the substrate heated to a temperature of at least about 200 to at most about 270° C.

4. The process according to claim 3 wherein the temperature of the atmosphere in said second zone is lower than the temperature of the atmosphere of said first zone.

5. The process according to claim 4 wherein the temperature of the second zone is about room temperature.

\* \* \* \* \*